(12) United States Patent
Abiko et al.

(10) Patent No.: US 7,243,911 B2
(45) Date of Patent: Jul. 17, 2007

(54) SUBSTRATE TREATING APPARATUS (75) Inventors: Yoshitaka Abiko, Kyoto (JP); Tomonori Kojimaru, Kyoto (JP); Keiji Magara, Kyoto (JP); Toshio Hiroe, Kyoto (JP); Koji Hasegawa, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 115 days.

(21) Appl. No.: 11/043,823

(22) Filed: Jan. 26, 2005

(65) Prior Publication Data

US 2005/0161839 A1 Jul. 28, 2005

(30) Foreign Application Priority Data

| Jan. 27, 2004 | (JP) | ............................ 2004-018567 |
| Jan. 30, 2004 | (JP) | ............................ 2004-023762 |
| Sep. 22, 2004 | (JP) | ............................ 2004-275497 |

(51) Int. Cl.
*B01F 3/04* (2006.01)
*C23G 1/02* (2006.01)

(52) U.S. Cl. .................. 261/122.1; 261/124; 134/137; 134/151; 134/902

(58) Field of Classification Search ............. 261/122.1, 261/123, 122.2, 124; 134/3, 37, 83, 94.1, 134/137, 102.2, 151, 902
See application file for complete search history.

(56) References Cited

U.S. PATENT DOCUMENTS

| 2,586,620 | A | * | 2/1952 | De Hart ..................... 134/99.1 |
| 4,080,975 | A | * | 3/1978 | Williams, Jr. ............... 137/94.1 |
| 5,071,488 | A | * | 12/1991 | Takayama et al. ............ 134/34 |
| 5,698,040 | A | * | 12/1997 | Guldi et al. ................. 134/1.3 |
| 5,817,185 | A | * | 10/1998 | Shindo et al. ............. 134/25.4 |
| 5,853,496 | A | * | 12/1998 | Honda .......................... 134/18 |
| 5,904,156 | A | * | 5/1999 | Advocate et al. .............. 134/2 |
| 6,054,062 | A | * | 4/2000 | Calio et al. ................. 438/745 |
| 2003/0188765 | A1 | * | 10/2003 | Christenson et al. .......... 134/3 |
| 2005/0087133 | A1 | * | 4/2005 | Shindo et al. .............. 118/715 |

FOREIGN PATENT DOCUMENTS

| JP | 1-135024 | 5/1989 |
| JP | 02-277557 | 11/1990 |
| JP | 8-2419 | 1/1996 |
| JP | 8-157884 | 6/1996 |

* cited by examiner

*Primary Examiner*—Scott Bushey
(74) *Attorney, Agent, or Firm*—Ostrolenk, Faber, Gerb & Soffen, LLP (57) ABSTRACT

A substrate treating apparatus for performing a predetermined treatment of substrates includes a treating tank for storing a treating solution, a holder for holding a plurality of substrates arranged in one direction inside the treating tank, and a bubble generating device for generating bubbles in the treating solution stored in the treating tank. The bubble generating device includes a plurality of cylindrical bodies extending in the one direction and arranged in a direction perpendicular to the one direction. Each of the cylindrical bodies is at least partly formed of a porous member extending in the one direction.

8 Claims, 10 Drawing Sheets

SUBSTRATE TREATING APPARATUS

BACKGROUND OF THE INVENTION (1) Field of the Invention

This invention relates to substrate treating apparatus for treating substrates such as semiconductor wafers and substrates for liquid crystal displays (hereinafter simply called substrates) by immersing the substrates in a treating solution stored in a treating tank.

(2) Description of the Related Art

A conventional apparatus of this type includes a plurality of spherical bubblers arranged in the bottom of the treating tank storing a treating solution. The bubbles are arranged in the direction of arrangement of a plurality of substrates under treatment (see Japanese Patent Publication No. 8-2419 (1998), for example).

Figure 1:
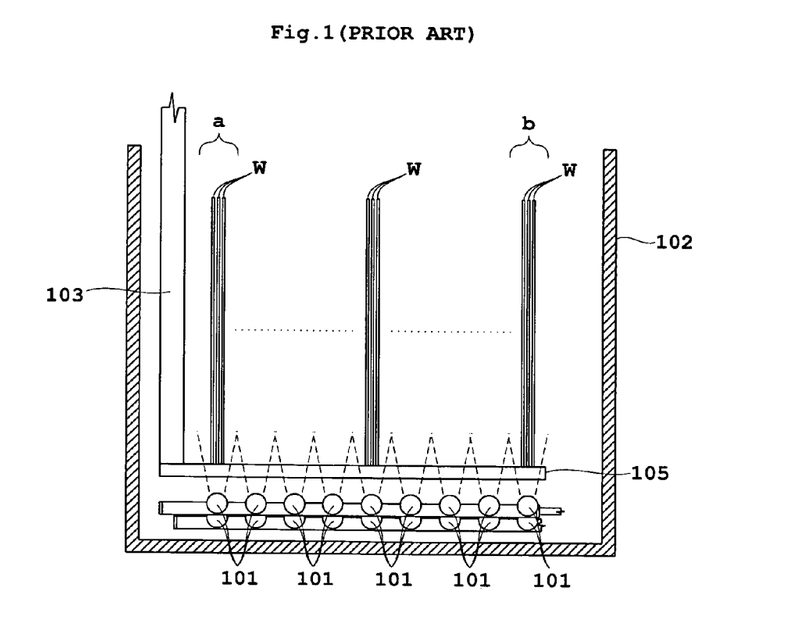
FIG. 1 is a side view showing an outline of a conventional apparatus.

FIG. 1 refers. FIG. 1 is a side view showing an outline of a conventional apparatus.

This apparatus includes a plurality of bubblers 101 arranged in the bottom of a treating tank 102. The bubblers 101 are arranged at fixed intervals in the direction of arrangement of a plurality of wafers W (i.e. the transverse direction in FIG. 1). The wafers W are held in upstanding posture by a vertically movable back plate 103 and support members 105 extending horizontally from lower positions of the back plate 103. A positional relationship between these elements is determined such that all the wafers W are enveloped in bubbles emerging and spreading upward from the bubblers 101.

Specific types of treatment performed by such an apparatus include cleaning, etching, stripping, particle removal and metal removal. More particularly, for example, sulfuric acid is used as a treating solution and heated to 120 to 130° C. or higher. Then, ozone gas is injected into the treating solution, and wafers W are immersed therein. At this time, a strong oxidizing substance such as peroxodisulfuric acid synthesized by sulfuric acid and ozone dissolves or strips off unwanted film such as resist film on the surfaces of wafers W.

The conventional apparatus noted above has the following drawbacks.

The conventional apparatus is slower in treating wafers W located in opposite end regions (region "a" and region "b" in FIG. 1) in the direction of arrangement of the plurality of wafers W than in treating the other wafers W located at and adjacent the middle. Thus, it is difficult to treat all the wafers W uniformly.

Further, the conventional apparatus has the bubblers 101 spaced from one another in the direction of arrangement of the wafers W. This results in different conditions in which the bubbles contact and act on the wafers W located right above the bubblers 101 and the wafers W located right above the spaces between the bubblers 101. Thus, the conventional apparatus has difficulties in treating all the wafers W uniformly.

SUMMARY OF THE INVENTION

This invention has been made having regard to the state of the art noted above, and its object is to provide a substrate treating apparatus improved in the way of supplying bubbles or gas to substrates, thereby treating all the substrates uniformly.

The above object is fulfilled, according to this invention, by a substrate treating apparatus for performing a predetermined treatment of substrates, comprising: a treating tank for storing a treating solution; a holder for holding a plurality of substrates arranged in one direction inside the treating tank; and a bubble generating device for generating bubbles in the treating solution stored in the treating tank; wherein the bubble generating device includes a plurality of cylindrical bodies extending in the one direction and arranged in a direction perpendicular to the one direction, each of the cylindrical bodies being at least partly formed of a porous member extending in the one direction.

The bubble generating device includes cylindrical bodies extending in the direction of arrangement of the substrates (i.e. in the one direction), and each of the cylindrical bodies is at least partly formed of a porous member extending in the direction of arrangement of the substrates (i.e. in the one direction). Thus, bubbles are generated continuously, without a break, in the direction of arrangement of the substrates. Since the bubble generating device is at least partly formed of porous members, fine bubbles may be generated from such parts. The fine bubbles contact all the substrates, regardless of positions in the direction of arrangement of the substrates. Thus, all the substrates may be treated uniformly. Since the plurality of cylindrical bodies are arranged also in the direction perpendicular to the direction of arrangement of the substrates, fine bubbles are generated to cover entire surfaces of the substrates. Since the bubbles contact all parts of each substrate, regardless of positions in the direction of the plane of the substrate, the entire surfaces of each substrate may be treated uniformly.

In this invention, the cylindrical bodies, preferably, are spaced from one another in the direction perpendicular to the one direction.

In many cases, the apparatus is constructed to drain the treating solution from a lower position of the treating tank. The cylindrical bodies spaced from one another, while supplying bubbles in the direction of the plane of each substrate during treatment, give little resistance to the treating solution being drained, thereby achieving a reduced draining time.

To solve the problem of the prior art noted hereinbefore, Inventors herein have conducted intensive research and attained the following findings.

Figure 2:
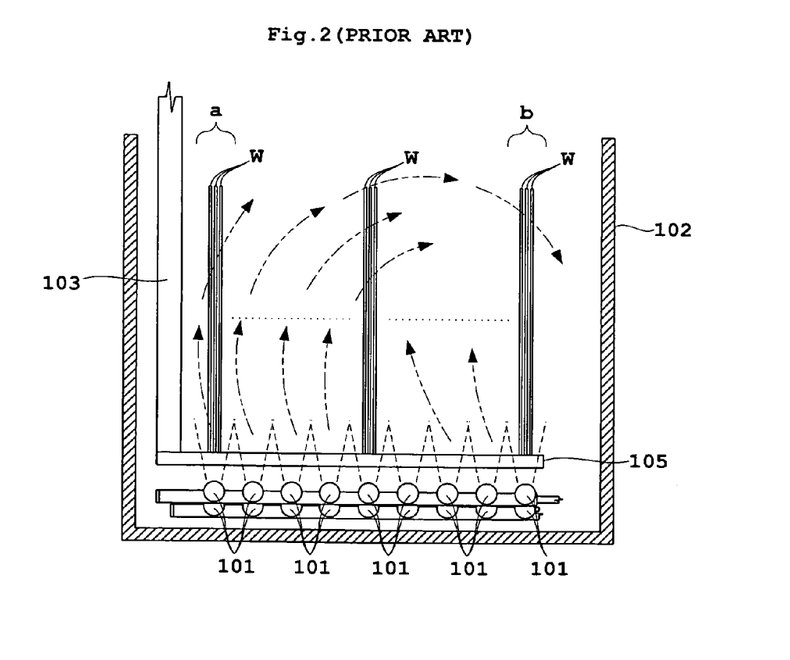
FIG. 2 is a schematic view showing a faulty condition occurring in the conventional apparatus.

Reference is now made to FIG. 2. FIG. 2 is a schematic view showing a faulty condition occurring in the conventional apparatus. When the treating tank 102 is observed from a side, the bubbles emerging and ascending from the bubblers 101 form vortices as shown in two-dot chain line arrows in FIG. 2. It has been found that, because of the vortices, the bubbles do not readily contact wafers W in opposite end regions (region "a" and region "b" in FIG. 2) in the direction of arrangement of wafers W. It has also become clear that such a phenomenon is conspicuous particularly when the gas is fed at a high flow rate.

Based on the above findings, a substrate treating apparatus for treating substrates, according to another aspect of the invention, comprises: a treating tank for storing a treating solution; a holder for holding a plurality of substrates arranged in one direction inside the treating tank; a plurality of bubblers arranged in the direction of arrangement of the substrates for introducing a gas into the treating solution stored in the treating tank, and supplying the gas to the substrates; and a gas feeder disposed in one of two spaces between the bubblers and the treating tank corresponding to opposite ends in the direction of arrangement of the substrates, for feeding the gas into the treating solution stored in the treating tank.

By supplying the gas from the gas feeder, bubbles are generated besides the bubbles from the bubblers. These additional bubbles are effective for preventing vortices formed by the bubbles from the bubblers, whereby the bubbles from the bubbler are directed upward. Consequently, the bubbles uniformly contact even the substrates located at the opposite ends in the direction of arrangement of the substrates, and thus all the substrates are treated uniformly.

In a further aspect of the invention, a substrate treating apparatus for treating substrates, comprises: a treating tank for storing a treating solution; a holder for holding a plurality of substrates arranged in one direction inside the treating tank; a plurality of bubblers arranged in the direction of arrangement of the substrates for introducing a gas into the treating solution stored in the treating tank, and supplying the gas to the substrates; a first gas feeder disposed in one of two spaces between the bubblers and the treating tank corresponding to opposite ends in the direction of arrangement of the substrates, for feeding the gas into the treating solution stored in the treating tank; and a second gas feeder disposed in the other of the two spaces for feeding the gas into the treating solution stored in the treating tank.

The gas from the first gas feeder in one space and the gas from the second gas feeder in the other produce a synergistic effect for reliably forming upward currents of the bubbles from the plurality of bubblers. Thus, the gas feeders prevent vortices formed by the bubbles from the bubblers, whereby the bubbles from the bubbler are directed upward. Consequently, the bubbles uniformly contact even the substrates located at the opposite ends in the direction of arrangement of the substrates, and thus all the substrates are treated uniformly.

Preferably, the first gas feeder and second gas feeder have a higher flow rate of the gas than the bubblers.

The first gas feeder and second gas feeder feeding the gas at a higher flow rate than the bubblers, besides the synergistic effect of the two parts of the gas, prevent within a reduced time the vortices formed by the bubbles from the bubblers, whereby the bubbles from the bubbler are directed upward in a reduced time.

In a still further aspect of the invention, a substrate treating apparatus for treating substrates, comprises: a treating tank for storing a treating solution; a holder for holding a plurality of substrates arranged in one direction inside the treating tank; a plurality of bubblers arranged in the direction of arrangement of the substrates for introducing a gas into the treating solution stored in the treating tank, and supplying the gas to the substrates; and a current generator disposed in one of two spaces between the bubblers and the treating tank corresponding to opposite ends in the direction of arrangement of the substrates, for generating currents of the treating solution to check vertices formed by bubbles from the bubblers.

The current generator generates currents of the treating solution to check vertices formed by the bubbles from the bubblers, thereby upwardly directing the bubbles from the bubblers. Consequently, the bubbles uniformly contact even the substrates located at the opposite ends in the direction of arrangement of the substrates, and thus all the substrates are treated uniformly.

In yet another aspect of the invention, a substrate treating apparatus for treating substrates, comprising: a treating tank for storing a treating solution; a holder for holding a plurality of substrates arranged in one direction inside the treating tank; a plurality of bubblers arranged in the direction of arrangement of the substrates for introducing a gas into the treating solution stored in the treating tank, and supplying the gas to the substrates; a first current generator disposed in one of two spaces between the bubblers and the treating tank corresponding to opposite ends in the direction of arrangement of the substrates, for generating currents of the treating solution; and a second current generator disposed in the other of the two spaces for generating currents of the treating solution.

In the above construction, the two current generators generate currents of the treating solution to prevent vortices of the bubbles with increased effect.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

First Embodiment

Figure 3:
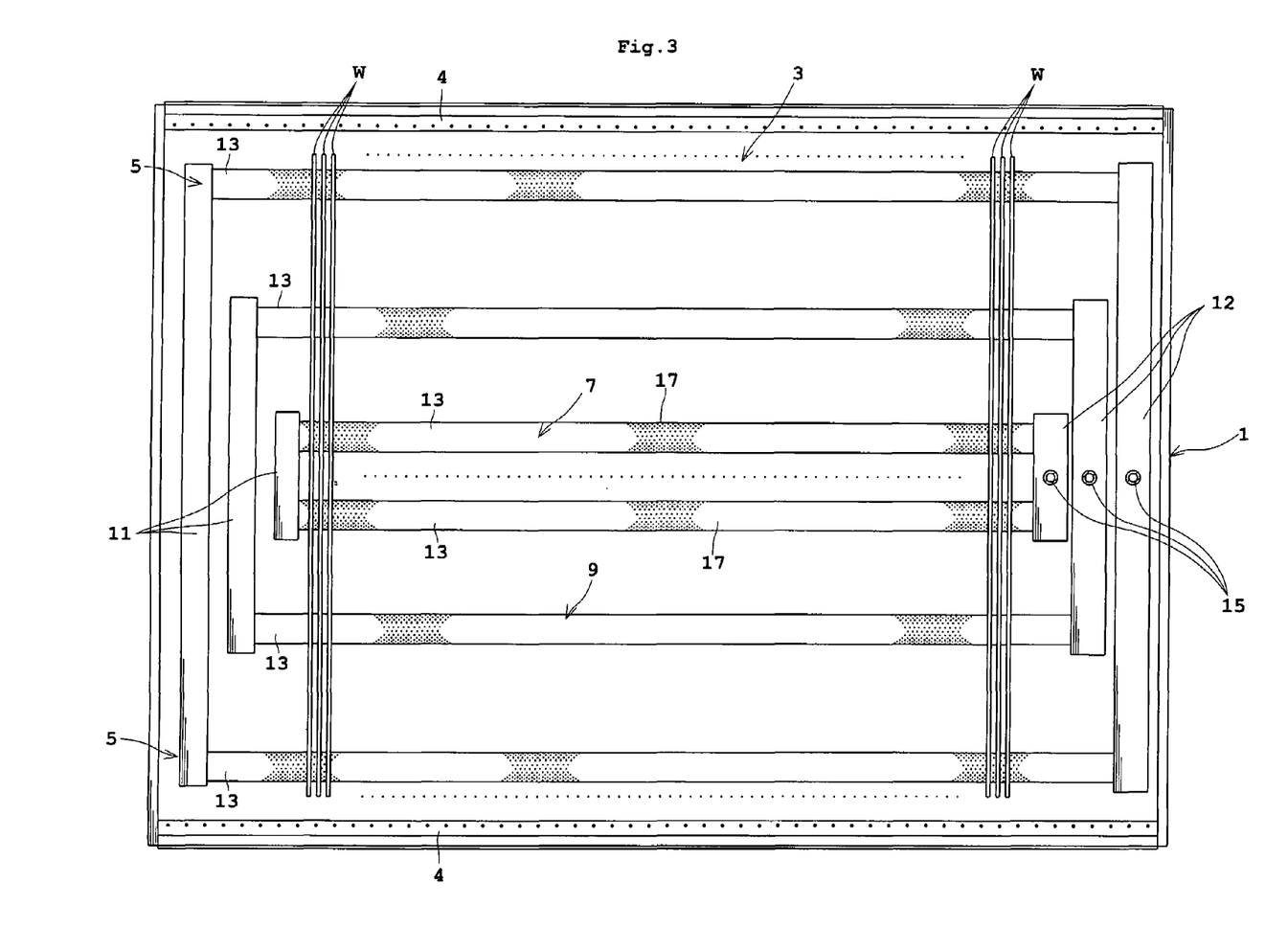
FIG. 3 is a plan view showing an outline of a substrate treating apparatus in a first embodiment.
Figure 4:
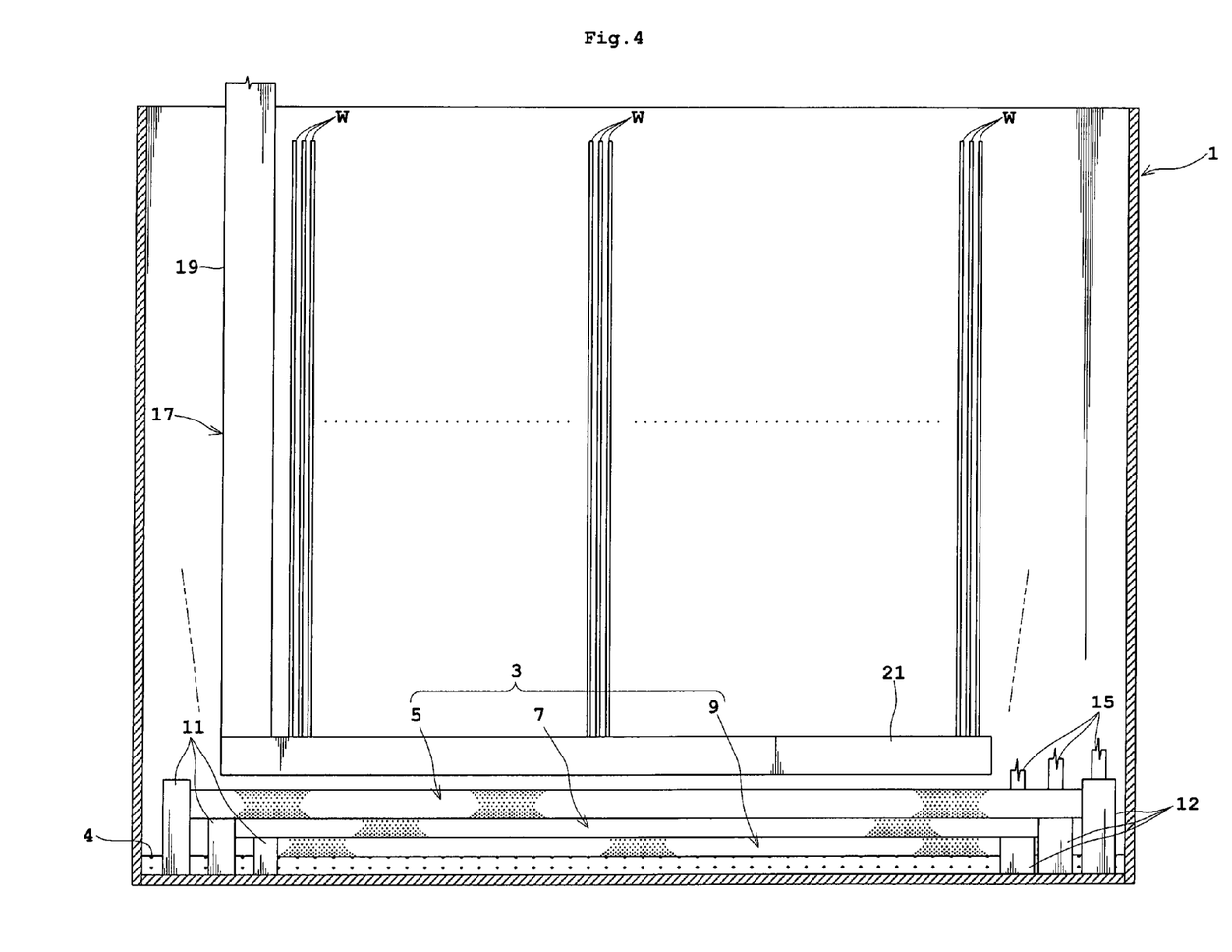
FIG. 4 is a side view showing the outline of the substrate treating apparatus in the first embodiment.

FIG. 3 is a plan view showing an outline of a substrate treating apparatus in a first embodiment. FIG. 4 is a side view showing the outline of the substrate treating apparatus in the first embodiment.

This substrate treating apparatus includes a treating tank 1 for storing a treating solution. The treating solution may be sulfuric acid, for example. The treating tank 1 has bubblers 3, which correspond to the bubble generating device, arranged adjacent the bottom thereof for supplying a gas. One example of the gas is ozone. The treating tank 1 has filling pipes 4 arranged adjacent the bottom thereof for supplying the treating solution, and a collecting tank (not shown) for collecting the treating solution overflowing the treating tank 1.

The bubblers 3 include a pair of opposite end bubblers 5, a pair of central bubblers 7 arranged in a central region in plan view between the opposite end bubblers 5, and a pair of auxiliary bubblers 9 arranged between the opposite end bubblers 5 and central bubblers 7. These bubblers 3 are spaced from one another, at predetermined intervals, in a direction perpendicular to a direction of arrangement of wafers W. The bubblers 3 are formed of a material resistant to the treating solution such as sulfuric acid. The opposite end bubblers 5, central bubblers 7 and auxiliary bubblers 9 have first mounting members 11 attached to one end region (left-hand side in FIGS. 3 and 4) of the bottom of the treating tank 1, second mounting members 12 attached to the other end region (right-hand side in FIGS. 3 and 4) of the bottom of the treating tank 1, bubbler main bodies 13, and introduction pipes 15 connected to the second mounting members 12 for introducing the gas (e.g. ozone), respectively. Each bubbler main body 13 is formed of a porous material throughout. This material may be porous silica (SiC) or quartz glass, for example. Each bubbler main body 13 is arranged to have a longitudinal axis thereof extending in the direction of arrangement of wafers W (i.e. the transverse direction in FIGS. 3 and 4).

Although each bubbler main body 13 in the above example is formed of a porous material throughout, each may be formed at least partly of a porous material, with the porous material extending in one direction. For example, each of the above bubbler main bodies 13 may be longitudinally divided into two or four parts which are connected in communication with each other by a silica tube or tubes. However, the joint or joints of the bubbler main body 13 by the silica tube or tubes should not be located directly under the wafers W.

The introduction pipes 15 are connected to a gas source not shown. The gas supplied from the gas source is transmitted through the introduction pipes 15 into the opposite end bubblers 5, central bubblers 7 and auxiliary bubblers 9, and released into the treating tank 1 from the total of six bubbler main bodies 13.

The central bubblers 7 are disposed lower than the opposite end bubblers 5, and the auxiliary bubblers 9 are disposed at a height intermediate therebetween (FIG. 4). This arrangement is suited to the circular wafers W. For treating rectangular substrates, the bubblers may be arranged all at an equal height.

The opposite end bubblers 5, central bubblers 7 and auxiliary bubblers 9 are arranged such that, when the wafers W are moved to a treating position by a lifter 17 (holder) described hereinafter, all the wafers W are covered by bubbles from the opposite end bubblers 5, central bubblers 7 and auxiliary bubblers 9 (as shown in two-dot chain lines in FIG. 4).

As shown in FIG. 4, a plurality of wafers W are loaded into and unloaded from the treating tank 1 by the lifter 17. The lifter 17 is not shown in FIG. 3, in order to better illustrate the other components. The lifter 17 includes a back plate 19 lying along the left-hand side wall of the treating tank 1, and support members 21 extending horizontally from lower positions of the back plate 19. The back plate 19 is vertically movable between the treating position inside the treating tank 1 (i.e. the position shown in FIG. 4) and a standby position above the treating tank 1. The support members 21 are, for example, in the form of thin plates, each having a plurality of cutouts, not shown, formed in an upper surface thereof. The wafers W are received at edges thereof in the cutouts to be supported in upstanding posture.

Figure 5:
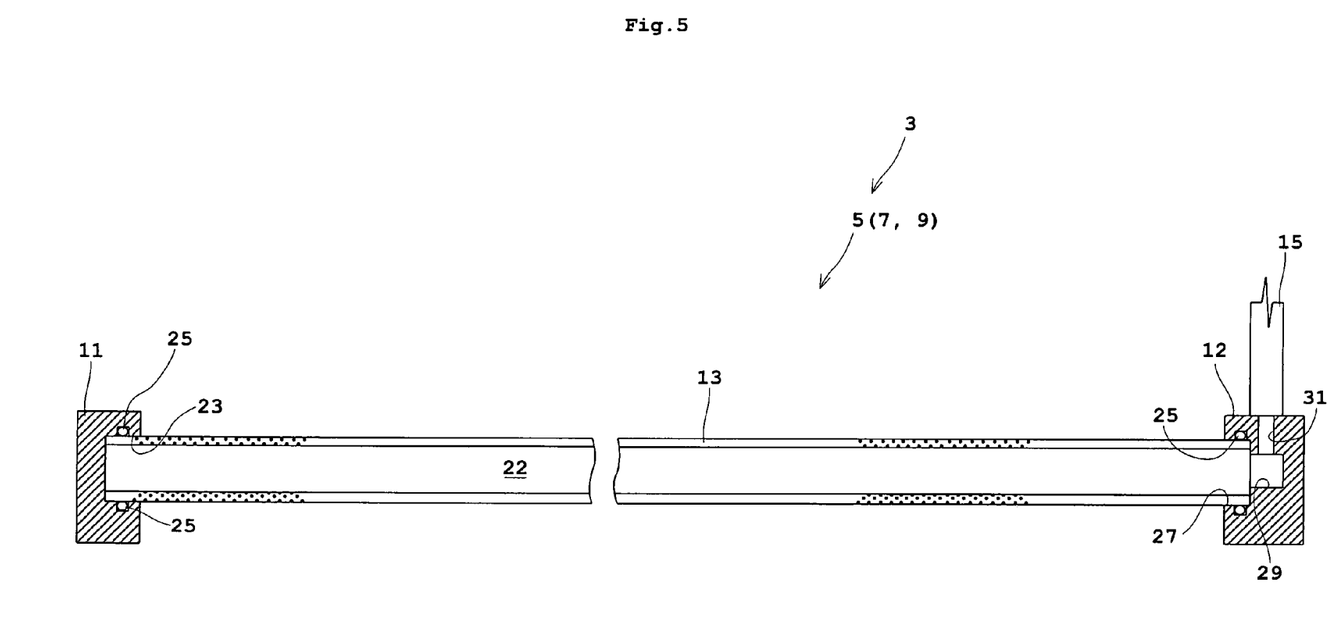
FIG. 5 is a view in vertical section showing the construction of a bubbler.

Next, the construction of opposite end bubblers 5, central bubblers 7 and auxiliary bubblers 9 constituting the bubblers 3, will be described with reference to FIG. 5. FIG. 5 is a view in vertical section showing the construction of each bubbler. While the opposite end bubblers 5 are described here, the central bubblers 7 and auxiliary bubblers 9 have a similar construction, the only difference being in the length of the bubbler main body 13.

The bubbler main body 13 has an integral hollow construction having a bar-like or, in particular a round rod-shaped, outward appearance, with the opposite ends thereof opening in a circular passage sectional shape. One end of the bubbler main body 13 is inserted into a recessed socket 23 formed in one of the first mounting members 11. An O-ring 25 is mounted inside the socket 23 for tight contact with a peripheral surface of the bubbler main body 13. As a result, one end of a hollow space 22 in the bubbler main body 13 is closed.

In the apparatus in this embodiment, as noted above, the bubbler main body 13 has an integral hollow construction. This simplifies the construction of the bubbler main body 13 to reduce the cost of the apparatus.

The other end of the bubbler main body 13 is inserted into a recessed socket 27 formed in one of the second mounting members 12. An O-ring 25 is mounted inside the socket 23 for tight contact with a peripheral surface of the bubbler main body 13. An introduction bore 29 is formed in a deep position of the socket 27. This introduction bore 29 communicates with the socket 27 and a connection bore 31 formed in an upper position. The connection bore 31 formed above the introduction bore 9 is connected to one of the introduction pipes 15. The gas is introduced into the hollow space 22 in the bubbler main body 13 through the connection bore 31 and introduction bore 29.

The apparatus having the above construction treats a plurality of wafers W as follows, for example.

The treating solution is supplied to and stored in the treating tank 1, and the gas is supplied at a predetermined flow rate to the introduction pipes 15 of the bubblers 3 (i.e. the opposite end bubblers 5, central bubblers 7 and auxiliary bubblers 9). Then, the gas is introduced into the hollow space 22 of each bubbler main body 13. Since each bubbler main body 13 has a porous construction throughout in addition to one end thereof being closed, bubbles are supplied into the treating tank 1 from the bubbler main body 13. A plurality of wafers W are transferred to the lifter 17 in the standby position. The lifter 17 is lowered to the treating position, and maintained there for a predetermined time. As a result, the plurality of wafers W are treated with the treating solution. A predetermined treatment is performed by a synergistic effect of the bubbles from the opposite end bubblers 5, central bubblers 7 and auxiliary bubblers 9.

Since this apparatus has the bubbler main bodies 13 in the form of cylinders with the longitudinal axes thereof extending in the direction of arrangement of wafers W, bubbles are generated continuously without breaks along the direction of arrangement of wafers W. Further, the bubbler main bodies 13 which are porous throughout can generate fine bubbles. Such fine bubbles contact all the wafers W, regardless of positions in the direction of arrangement of wafers W. Thus, all the wafers W may be treated uniformly. Since the plurality of bubbler main bodies 13 are arranged also in the direction perpendicular to the direction of arrangement of wafers W, fine bubbles are generated to cover entire surfaces of wafers W. Since bubbles contact all parts of each wafer W, regardless of positions in the direction of the plane of the wafer W, the entire surfaces of each wafer W may be treated uniformly.

When the treatment for the predetermined time is completed, the treating solution is drained from a drain port, not shown, formed in the bottom of the treating tank 1. In the apparatus in this embodiment, the six bubbler main bodies 13 are spaced from one another in the direction of the plane of each wafer W. This arrangement gives little resistance to the treating solution being drained, thereby achieving a reduced draining time.

Figure 6:
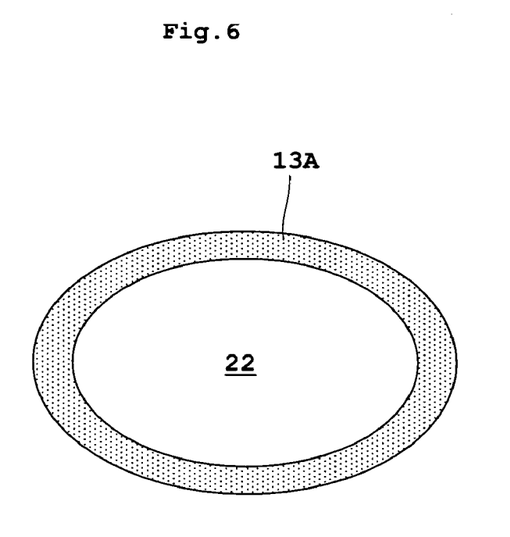
FIG. 6 is a view in vertical section of a bubbler main body in a first modification.
Figure 7:
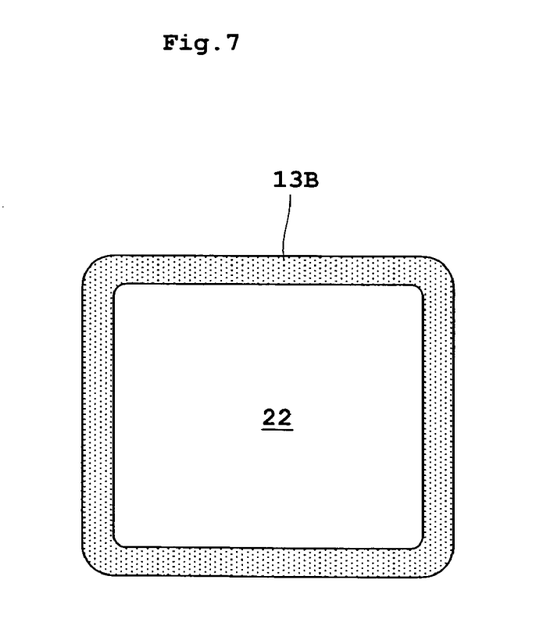
FIG. 7 is a view in vertical section of a bubbler main body in a second modification.

This invention is not limited to the embodiment described above, but may be modified as follows:

(1) The bubbler main body 13 described above has openings in a circular passage sectional shape. As in a bubbler main body 13A shown in FIG. 6, the passage section may be elliptical. As in a bubbler main body 13B shown in FIG. 7, the passage section may be rectangular. Where such passage sectional shapes are adopted, an enlarged upper area is secured for facing the wafers W. Then, the bubbles generated from the bubbler main body 13 may be directed to the wafers W efficiently.

(2) The bubblers 3 described above include six bubbler main bodies 13. Instead, four bubbler main bodies 13 may be provided, for example. Two bubbler main bodies 13 may be provided where the wafers W are small size, or eight bubbler main bodies 13 may be provided where the wafers W are large. The number of bubbler main bodies 13 does not need to be even. Only one bubbler main body 13 may be disposed directly under the wafers W. Furthermore, an even number of bubbler main bodies 13 may be additionally arranged opposite each other across the one bubbler main body 13, to make an odd total number of bubblers 3.

Second Embodiment

Figure 8:
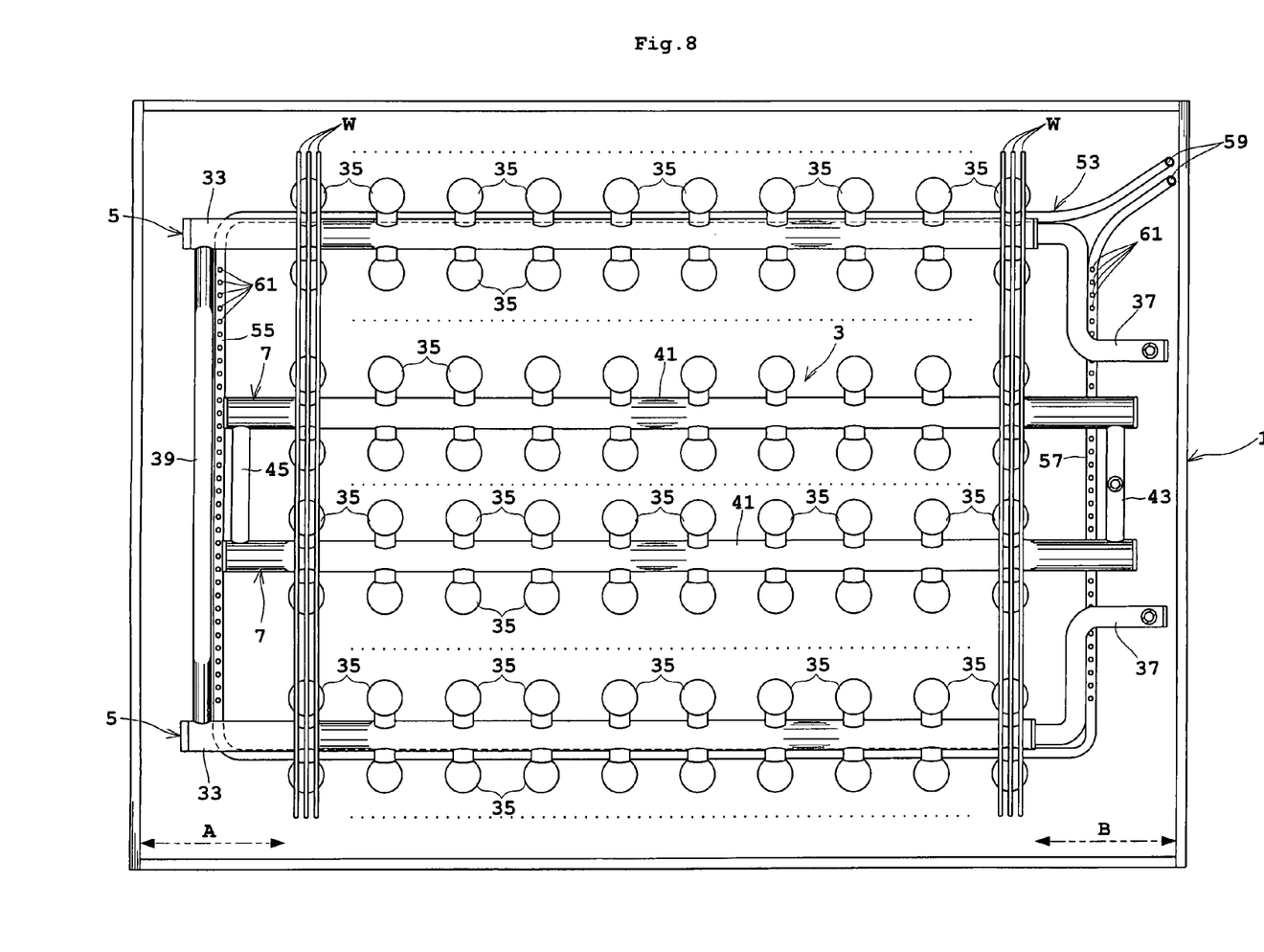
FIG. 8 is a plan view showing an outline of a substrate treating apparatus in a second embodiment.
Figure 9:
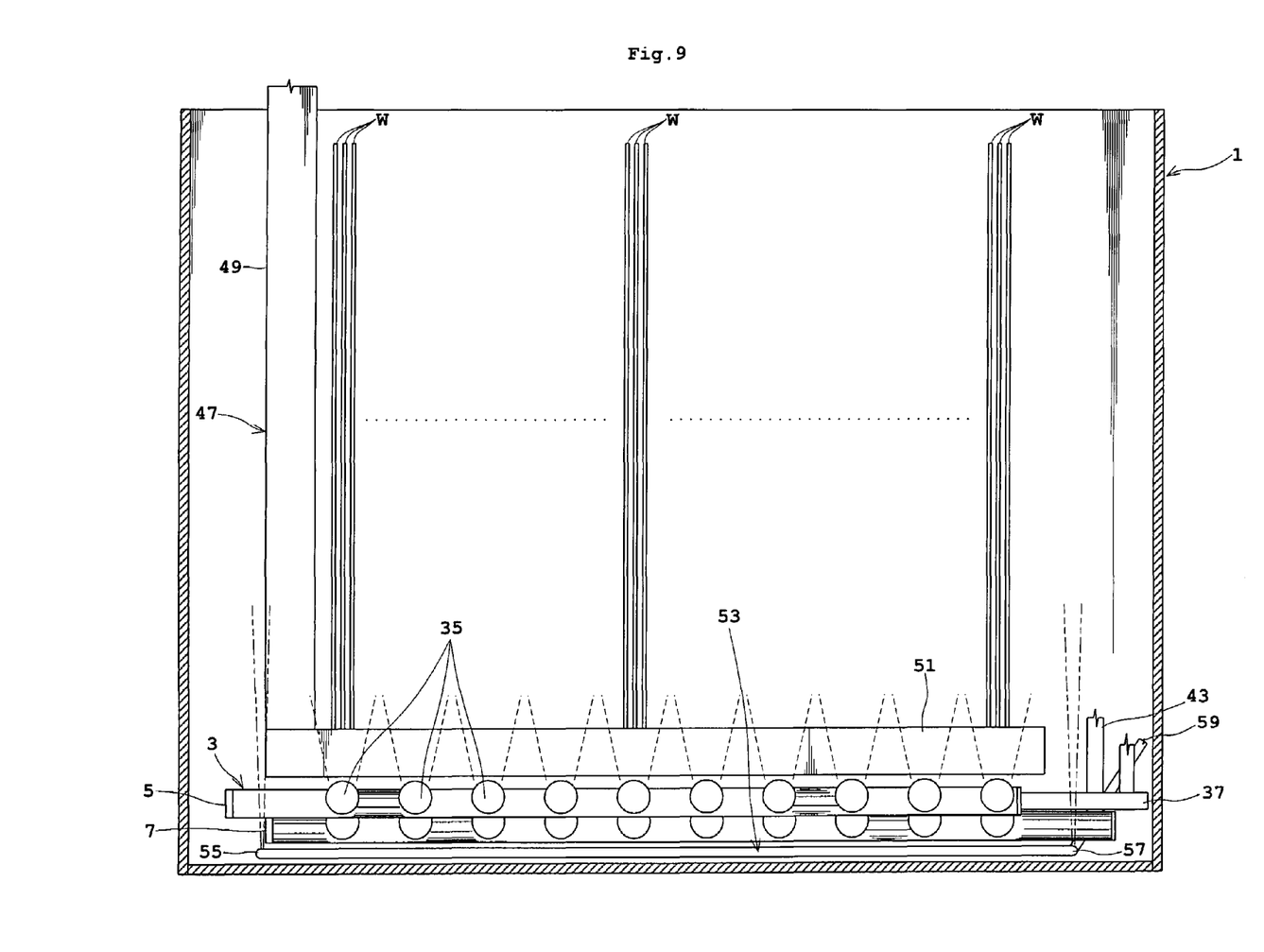
FIG. 9 is a side view showing the outline of the substrate treating apparatus in the second embodiment.

FIG. 8 is a plan view showing an outline of a substrate treating apparatus in a second embodiment. FIG. 9 is a side view showing the outline of the substrate treating apparatus in the second embodiment.

This substrate treating apparatus includes a treating tank 1 for storing a treating solution. The treating solution may be sulfuric acid ($H_2SO_4$), for example. The treating tank 1 has bubblers 3 arranged adjacent the bottom thereof for supplying a gas. One example of the gas is ozone. The treating tank 1 has filling pipes, not shown, arranged adjacent the bottom thereof for supplying the treating solution, and a collecting tank, not shown, for collecting the treating solution overflowing the treating tank 1.

The bubblers 3 include opposite end bubblers 5, and central bubblers 7 arranged between the opposite end bubblers 5. These bubblers 3 are formed of quartz glass which is resistant to the treating solution such as sulfuric acid. The opposite end bubblers 5 include main pipes 33, bubbler bodies 35 mounted peripherally of the main pipes 33, charging lines 37 connected to proximal ends of the main pipes 33 (in space B in FIG. 8 and the right-hand side in FIG. 9), and a communicating pipe 39 interconnecting the two main pipes 33 at distal ends thereof (in space A in FIG. 8 and the left-hand side in FIG. 9). The bubbler bodies 35 have a spherical configuration, and are formed of an open-cell porous material. The bubbler bodies 35 may have a configuration other than spherical, such as a rod-like shape.

The charging lines 37 are connected to a gas source not shown. The gas supplied from the gas source is transmitted through the charging lines 37 into the main pipes 33 of opposite end bubblers 5, and supplied into the treating tank 1 from the bubbler bodies 35.

The central bubblers 7 are disposed lower than the opposite end bubblers 5 (FIG. 9). This arrangement is suited to circular wafers W. For treating rectangular substrates, the bubblers may be arranged all at an equal height.

These central bubblers 7 are provided, as are the above opposite ends bubblers 5, for releasing the gas into the treating tank 1. The central bubblers 7 include main pipes 41, bubbler bodies 35 mounted peripherally of the main pipes 41, a charging line 43 connected to proximal ends of the main pipes 41 (in space B in FIG. 8 and the right-hand side in FIG. 9), and a communicating pipe 45 interconnecting the two main pipes 41 at distal ends thereof (in space A in FIG. 8 and the left-hand side in FIG. 9). As in the case of the opposite end bubblers 5, the charging line 43 is connected to the gas source not shown.

The bubbler bodies 35 of the bubblers 3 are arranged such that, when wafers W are moved to a treating position by a lifter 47 described hereinafter, all the wafers W are covered by bubbles from the bubblers 3 (as shown in dotted lines in FIG. 9). The plurality of bubbler bodies 35 correspond to the plurality of bubblers in this invention.

As shown in FIG. 9, a plurality of wafers W are loaded into and unloaded from the treating tank 1 by the lifter 47. The lifter 47 is not shown in FIG. 8, in order to better illustrate the other components. The lifter 47 includes a back plate 49 lying along the left-hand side wall of the treating tank 1, and support members 51 extending horizontally from lower positions of the back plate 49. The back plate 49 is vertically movable between the treating position inside the treating tank 1 and a standby position above the treating tank 1. The support members 51 are, for example, in the form of thin plates, each having a plurality of cutouts, not shown, formed in an upper surface thereof. The wafers W are received at edges thereof in the cutouts to be supported in upstanding posture.

A tube bubbler 53 is arranged between the bubblers 3 and the bottom of the treating tank 1. As are the bubblers 3, this tube bubbler 53 is formed of a material resistant to the treating solution. As shown in FIG. 9, the tube bubbler 53 extends along areas of height level below the central bubblers 7. In plan view, as shown in FIG. 8, the tube bubbler 53 extends along areas adjacent and outside one main pipe 33, between the communicating tube 39 and the communicating tube 45 of the central bubblers 7, adjacent and outside the other main pipe 33, and between the proximal ends of the main pipes 41 and the communicating pipe 43. The portion of the tube bubbler 53 extending along the left-hand side is called herein the first arm 55, and the portion extending along the right-hand side is called the second arm 57. The opposite ends of the tube bubbler 53 are called supply ports 59.

Each of the first arm 55 and second arm 57 has a plurality of discharge bores 61 formed in upper positions thereof. These discharge bores 61 are, for example, about 0.5 mm in diameter. Two spaces A and B exist between the bubbler bodies 35 of the bubblers 3 and side walls of the treating tank 1. When the lifter 47 is in the treating position, the first arm 55 is located in the space A, and the second arm 57 in the space B. From these first arm 55 and second arm 57 bubbles are generated as shown in two-dot chain lines in FIG. 9.

The first arm 55 corresponds to the first gas feeder in this invention. The second arm 57 corresponds to the second gas feeder in this invention.

The apparatus having the above construction treats a plurality of wafers W as follows, for example.

First, the treating solution is supplied to and stored in the treating tank 1. The gas is supplied at a first flow rate to the charging lines 37 and 43 of the bubblers 3, and at a second flow rate, higher than the first flow rate, to the supply ports 59 of the tube bubbler 53, thereby generating bubbles in the treating tank 1. A plurality of wafers W are transferred to the lifter 47 in the standby position. The lifter 47 is lowered to the treating position, and maintained there for a predetermined time. As a result, the plurality of wafers W are treated with the treating solution. A predetermined treatment is performed by a synergistic effect of the bubbles from the bubblers 3. At this time, bubbles issue with force from both the first arm 55 and second arm 57 of the tube bubbler 53. This produces the effect of efficiently preventing vortices formed by the bubbles from the bubblers 3, whereby the bubbles from the bubblers 3 are directed upward. Consequently, the bubbles from the bubblers 3 contact all the wafers W uniformly. Variations in the treatment are avoided even for the wafers W located at the opposite ends, and thus all the wafers W are treated uniformly.

This substrate treating apparatus is advantageous in being easy to manufacture since its construction is simple and requires only the tube bubbler 53 to be added to an existing construction. With no vortices generated, particles in the treating solution are discharged smoothly as entrained by flows of the treating solution, without being trapped inside the treating tank 1. The replaceability of particles is thus enhanced, thereby realizing a treatment of wafers W with a high degree of cleanness.

It is desirable to supply the gas to the tube bubbler 53 at a higher flow rate than to the bubblers 3 as described above. However, the gas may be supplied at the same flow rate to both, or at a reduced flow rate to the tube bubbler 53. The discharge bores 61 may be formed in the sides (side surfaces) and/or the bottom (lower surface) of each of the first arm 55 and second arm 57.

Modifications of the above embodiment will be described hereinafter.

<First Modification>

Figure 10:
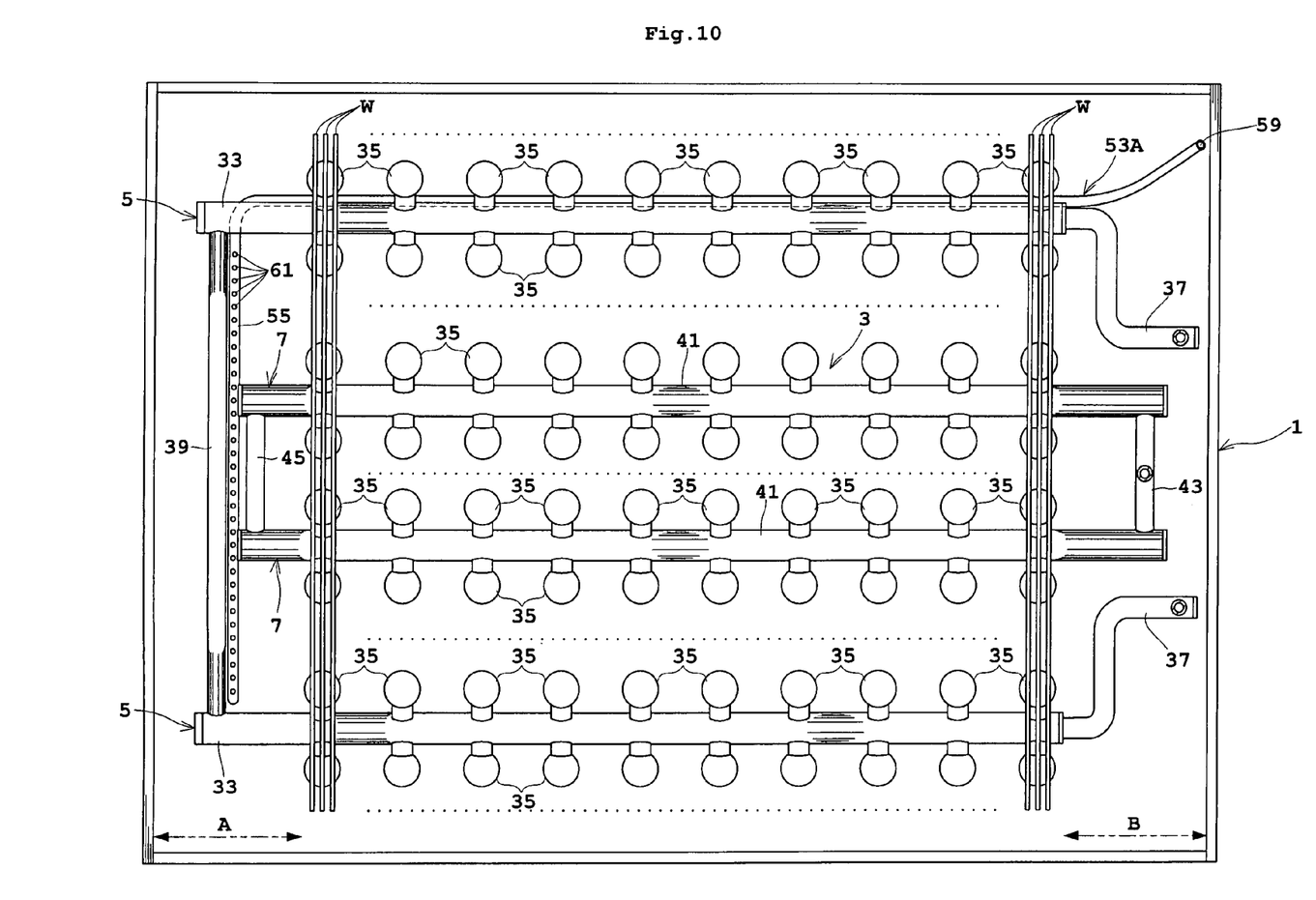
FIG. 10 is a plan view showing a first modification.

FIG. 10 refers. FIG. 10 is a plan view showing a first modification.

In this modification, the treating tank 1 includes a tube bubbler 53A. The tube bubbler 53A is approximately hook-shaped in plan view, and is disposed only in the space A. In other words, this tube bubbler 53A has only the first arm 55.

This construction, as is the second embodiment described above, is effective to prevent vortices formed by the bubbles from the bubblers 3. Thus, substantially the same advantage is secured as in the second embodiment, and besides the tube bubbler 53A may be manufactured at a reduced cost.

<Second Modification>

Figure 11:
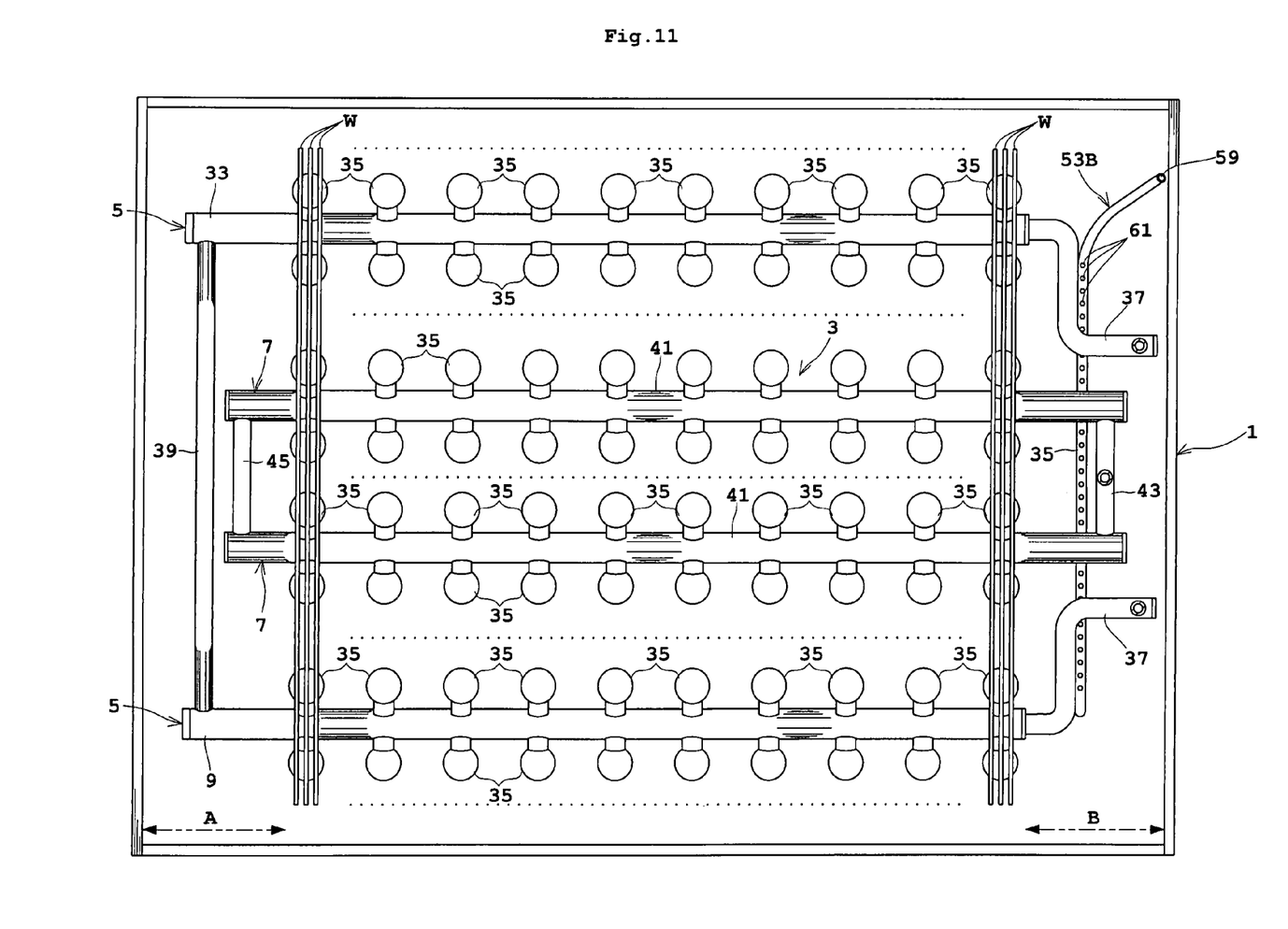
FIG. 11 is a plan view showing a second modification.

FIG. 11 refers. FIG. 11 is a plan view showing a second modification.

In this modification, the treating tank 1 includes a tube bubbler 53B. The tube bubbler 53B is approximately rod-shaped in plan view, and is disposed only in the space B. In other words, this tube bubbler 53A has only the second arm 57.

This construction, as is the second embodiment described above, is effective to prevent vortices formed by the bubbles from the bubblers 3. Thus, substantially the same advantage is secured as in the second embodiment, and besides the tube bubbler 53B may be manufactured at a reduced cost.

Third Embodiment

Next, a third embodiment of this invention will be described with reference to FIG. 12.

Figure 12:
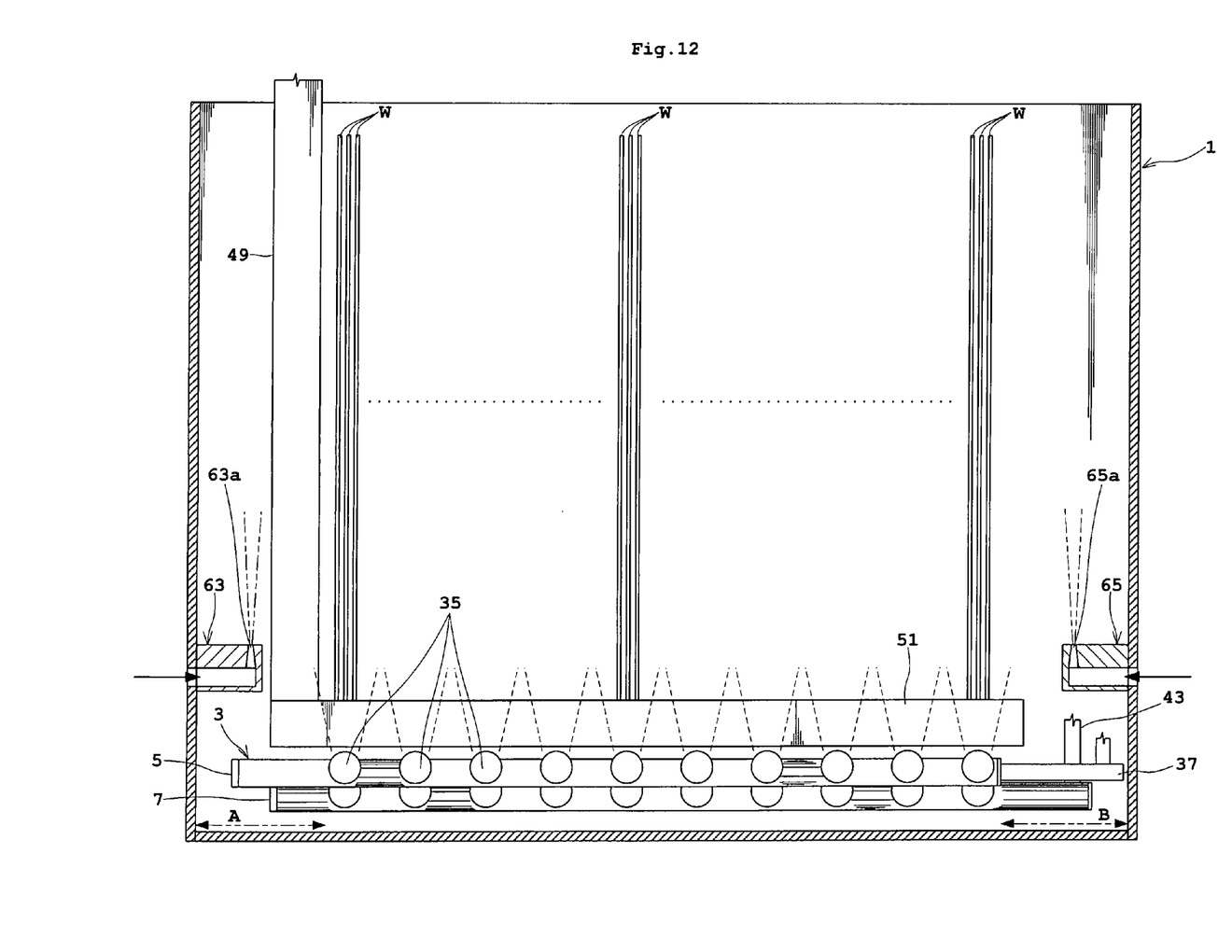
FIG. 12 is a side view showing an outline of a substrate treating apparatus in a third embodiment.

FIG. 12 is a side view showing an outline of a substrate treating apparatus in the third embodiment.

The second embodiment and its modifications described above have constructions for preventing vortices formed by the bubbles from the bubblers 3 by generating bubbles independently of the bubblers 3. As distinct from these constructions, the third embodiment positively form currents of the treating solution in order to prevent vortices produced in the treating tank 1 by the bubbles from the bubblers 3.

The treating tank 1 includes a first current generating nozzle 63 and a second current generating nozzle 65. The first current generating nozzle 63 is attached to the side wall of the treating tank 1 adjacent the space A, and has a discharge bore or bores 63a formed in an upper surface thereof for spouting the treating solution upward (two-dot chain lines in FIG. 12). The second current generating nozzle 65 is attached to the side wall of the treating tank 1 adjacent the space B, and has a discharge bore or bores 65a formed in an upper surface thereof for spouting the treating solution upward. The treating solution spouted from these first current generating nozzle 63 and second current generating nozzle 65, preferably, is the part of the treating solution recirculated after having overflowed the treating tank 1. This provides the advantages of reducing consumption of the treating solution in the treating tank 1, and avoiding adverse effects on the treatment by the treating solution supplied at different temperatures. The currents of the solution are set to a magnitude for checking and preventing vortices being generated by the bubbles from the bubblers 3.

The first current generating nozzle 63 corresponds to the first current generator, and the second current generating nozzle 65 to the second current generator.

The above construction generates currents of the treating liquid for checking vortices, and thus upwardly directing the bubbles from the bubblers 3. Consequently, the bubbles will uniformly contact wafers W in opposite end regions in the direction of arrangement of wafers W, thereby treating the plurality of wafers W uniformly.

In the third embodiment, as in the second embodiment described above, a current generating nozzle may be disposed in only one of the spaces A and B.

In each embodiment described hereinbefore, the treating solution has sulfuric acid as liquid and ozone as gas. This invention is applicable also to substrate treating apparatus that use other types of treating solution.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates, comprising:
    a treating tank for storing a treating solution;
    a holder for holding a plurality of substrates arranged in one direction inside said treating tank;
    a plurality of bubblers arranged in the direction of arrangement of said substrates for introducing a gas into said treating solution stored in said treating tank, and supplying the gas to said substrates; and
    a gas feeder disposed in one of two spaces between said bubblers and said treating tank corresponding to opposite ends in the direction of arrangement of said substrates, for feeding the gas into said treating solution stored in said treating tank.

2. An apparatus as defined in claim 1, wherein said gas feeder has a higher flow rate of the gas than said bubblers.

3. A substrate treating apparatus for treating substrates, comprising:
    a treating tank for storing a treating solution;
    a holder for holding a plurality of substrates arranged in one direction inside said treating tank;

a plurality of bubblers arranged in the direction of arrangement of said substrates for introducing a gas into said treating solution stored in said treating tank, and supplying the gas to said substrates;

a first gas feeder disposed in one of two spaces between said bubblers and said treating tank corresponding to opposite ends in the direction of arrangement of said substrates, for feeding the gas into said treating solution stored in said treating tank; and a second gas feeder disposed in the other of the two spaces for feeding the gas into said treating solution stored in said treating tank.

4. An apparatus as defined in claim 3, wherein said first gas feeder and said second gas feeder have a higher flow rate of the gas than said bubblers.

5. An apparatus as defined in claim 1, wherein said holder includes a back plate lying along an inner wall of said treating tank, said back plate being vertically movable between a position inside said treating tank and a position above said treating tank, and support members extending horizontally from lower positions of said back plate for supporting the plurality of substrates in upstanding posture.

6. An apparatus as defined in claim 2, wherein said holder includes a back plate lying along an inner wall of said treating tank, said back plate being vertically movable between a position inside said treating tank and a position above said treating tank, and support members extending horizontally from lower positions of said back plate for supporting the plurality of substrates in upstanding posture.

7. An apparatus as defined in claim 3, wherein said holder includes a back plate lying along an inner wall of said treating tank, said back plate being vertically movable between a position inside said treating tank and a position above said treating tank, and support members extending horizontally from lower positions of said back plate for supporting the plurality of substrates in upstanding posture.

8. An apparatus as defined in claim 4, wherein said holder includes a back plate lying along an inner wall of said treating tank, said back plate being vertically movable between a position inside said treating tank and a position above said treating tank, and support members extending horizontally from lower positions of said back plate for supporting the plurality of substrates in upstanding posture.

* * * * *